US006868518B2

(12) United States Patent
Yuan et al.

(10) Patent No.: US 6,868,518 B2
(45) Date of Patent: Mar. 15, 2005

(54) LOOK-UP TABLE ADDRESSING SCHEME

(75) Inventors: Warm Shaw Yuan, San Diego, CA (US); Mingming Zhang, San Diego, CA (US); Handi Santosa, San Diego, CA (US)

(73) Assignees: Sony Corporation, Tokyo (JP); Sony Electronics Inc., Park Ridge, NJ (US)

( * ) Notice: Subject to any disclaimer, the term of this patent is extended or adjusted under 35 U.S.C. 154(b) by 414 days.

(21) Appl. No.: 09/905,661

(22) Filed: Jul. 12, 2001

(65) Prior Publication Data

US 2003/0056167 A1 Mar. 20, 2003

(51) Int. Cl.[7] .............................................. H03M 13/00
(52) U.S. Cl. ..................................... 714/759; 714/794
(58) Field of Search ................................ 714/759, 786, 714/791–794, 752, 755; 375/341, 262; 708/235, 208

(56) References Cited

U.S. PATENT DOCUMENTS

| | | | | |
|---|---|---|---|---|
| 6,014,411 | A | | 1/2000 | Wang .......................... 375/259 |
| 6,263,467 | B1 | * | 7/2001 | Hladik et al. ................ 714/755 |
| 6,393,076 | B1 | * | 5/2002 | Dinc et al. ................... 375/341 |
| 6,425,107 | B1 | * | 7/2002 | Caldara et al. .............. 714/759 |
| 6,477,679 | B1 | * | 11/2002 | Such et al. ................... 714/755 |

OTHER PUBLICATIONS

Valenti, M.C., "An Introduction to Turbo Codes," Unpublished Report, May 1996, available at http://www.cs.wvu.edu/~mvalenti/pubs.html, 7pp.
Robertson, P., et al., "A Comparison of Optimal and Sub–Optimal MAP Decoding Algorithms Operating in the Log Domain," IEEE Int'l. Conf. on Communications (Seattle, WA), Jun. 1995, pp. 1009–1013.
Berrou, C., et al., "Near Shannon Limit Error—Correcting Coding and Decoding: Turbo Codes (1)," IEEE Int'l. Conf. on Comm. May 1993, pp. 1064–1070.
Robertson, P., et al., "Optimal and Sub–Optimal Maximum a Posteriori Algorithms Suitable for Turbo Decoding," European Transactions on Telecommunications, vol. 8, No. 2, Mar.–Apr. 1997, pp. 119–125.
Berrou, C., et al., "Near Optimum Error Correcting Coding and Decoding: Turbo–Codes," IEEE Transactions on Communications, vol. 44, No. 10, Oct. 1996, pp. 1261–1271.
Pauluzzi, D.R., et al., "A Comparison of SNR Estimation Techniques in the AWGN Channel," IEEE Transactions on Communications, vol. 48, No. 10, Oct. 2000, pp. 1681–1691.
3GPP Radio Access Network Technical Specification, 3G TS 25 212 V3.0.0, "Multiplexing and Channel Coding (FDD)," 1999, 20 pp.
TR45—Physical Layer Standard for cdma2000 Spread Spectrum Systems, TIA/EIA/IS–2000.2, 3–73/3–84.
http://www-sc.enst-bretagne.fr/turbo/historic.html "A brief historic of turbo codes:", 4/7/200.
Hess, J. "Implementation of a Turbo Decoder on a Configurable Computing Platform," Thesis submitted to Virginia Polytechnic Institute and State University, Sep. 1999, 74 pp.

* cited by examiner

Primary Examiner—Shelly A Chase
(74) Attorney, Agent, or Firm—Mayer Fortkort & Williams, PC; Karin L. Williams, Esq.

(57) ABSTRACT

A method for performing a table look-up operation on a first table having N entries includes generating a second table having kN entries based on the first table. The method includes generating a first data field for the second table including table index values having a second interval derived from a first interval of the table index values of the first table and represented by an n-bit binary number; and generating a second data field including computed table values derived from the computed table values of the first table or computed based on the function defining the second data field. The method further includes computing an index value z, extracting address bits from the index value z, where the address bits are data bits more significant than the (n-1)th bit of the index value z, and addressing the second table using the address bits.

18 Claims, 7 Drawing Sheets

| $\widetilde{z} = z\sigma^2$ | $\log_{s\text{-}table}(\widetilde{z}) = \log(1+e^{-z})\sigma^2$ |
|---|---|
| $\widetilde{z}_0$ | $\widetilde{a}_0$ |
| $\widetilde{z}_1$ | $\widetilde{a}_1$ |
| $\widetilde{z}_2$ | $\widetilde{a}_2$ |
| ⋮ | ⋮ |
| $\widetilde{z}_{N-1}$ | $\widetilde{a}_{N-1}$ |

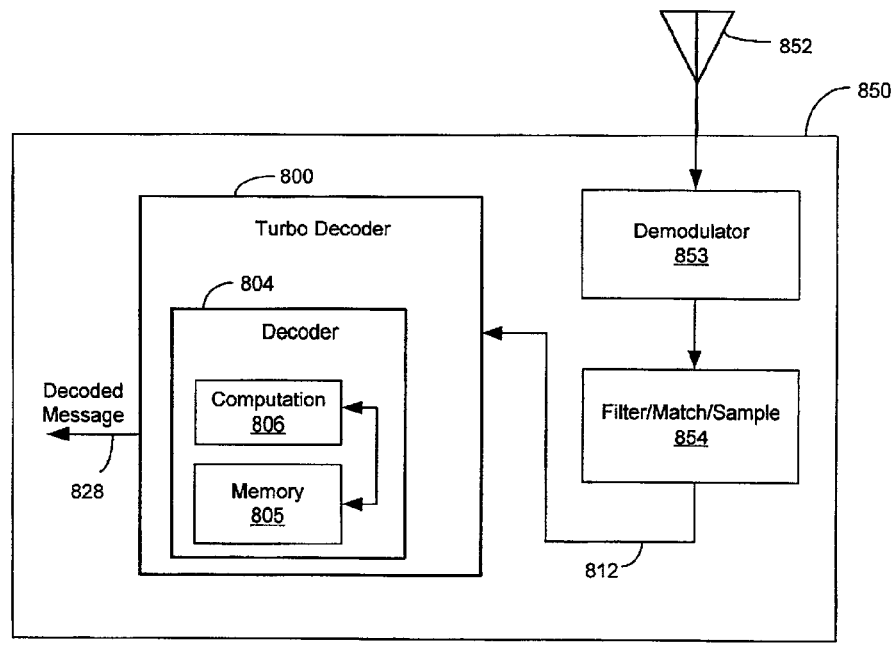

LOOK-UP TABLE ADDRESSING SCHEME

CROSS-REFERENCE TO RELATED APPLICATION

The present application is related to concurrently filed U.S. patent application Ser. No.:09/905,568, entitled "An Implementation of a Turbo Decoder" of W. S. Yuan; concurrently filed U.S. patent application Ser. No.:09/905,521, entitled "Look-up Table Index Value Generation in a Turbo Decoder" of Zhang et al.; and concurrently filed U.S. patent application Ser. No.:09/905,780 entitled "A Stop Iteration Criterion for Turbo Decoding" of Yuan et al. The applications referenced herein and the present application are commonly assigned and have at least one common inventor.

BACKGROUND OF THE INVENTION

1. Field of the Invention

The invention generally relates to the field of error correction codes for communication systems, and in particular, the present invention relates to implementations of turbo decoding methods and systems.

2. Background of the Invention

In digital communication systems, information (such as data or voice) are transmitted through a channel which is often noisy. The noisy channel introduces errors in the information being transmitted such that the information received at the receiver is different from the information transmitted. To reduce the probability that noise in the channel could corrupt the transmitted information, communication systems typically employ some sort of error correction scheme. For instance, wireless data communication systems, operated in a low signal to noise ratio (SNR) environment, typically employ forward error correction (FEC) schemes. When FEC coding is used, the transmitted message is encoded with sufficient redundancies to enable the receiver to correct some of the errors introduced in the received message by noise in the communication channel.

Various FEC coding schemes are known in the art. In particular, turbo codes are a type of FEC codes that are capable of achieving better error performance than the conventional FEC codes. In fact, it has been reported that turbo codes could come within 0.7 dB of the theoretical Shannon limit for a bit error rate (BER) of $10^{-5}$. Because turbo codes can achieve exceptionally low error rates in a low signal-to-noise ratio environment, turbo codes are particularly desirable for use in wireless communications where the communication channels are especially noisy as compared to wired communications. In fact, the recent CDMA wireless communications standard includes turbo codes as one of the possible encoding scheme. For a detailed description of turbo coding and decoding schemes, see "Near Shannon limit error-correcting coding and decoding: Turbo-codes (1)," Berrou et al., Proc., IEEE Int'l Conf. on Communications, Geneva, Switzerland, pp. 1064-1070, 1993, and "Iterative decoding of binary block and convolutional codes," Hagenauer et al., IEEE Trans. Inform. Theory, pp. 429-445, March 1996, which are incorporated herein by reference in their entireties. In brief, turbo codes are the parallel concatenation of two or more recursive systematic convolutional codes, separated by pseudorandom interleavers. Decoding of turbo codes involves an iterative decoding algorithm.

While turbo codes have the advantage of providing high coding gains, decoding of turbo codes is often complex and involves a large amount of complex computations. Turbo decoding is typically based on the maximum a posteriori (MAP) algorithm which operates by calculating the maximum a posteriori probabilities for the encoded data. While it has been recognized that the MAP algorithm is the optimal decoding algorithm for turbo codes, it is also recognized that implementation of the MAP decoding algorithm is very difficult in practice because of its computational complexities. To ease the computational burden of the MAP algorithm, approximations and modifications to the MAP algorithm have been developed. These include the Max-Log-MAP algorithm and the Log-MAP algorithm. The MAP, Max-Log-MAP and Log-MAP algorithms are described in detail in "A Comparison of Optimal and Sub-Optimal MAP Decoding Algorithms Operating in the Log Domain," Robertson et al., IEEE Int'l Conf. on Communications (Seattle, Wash.), June, 1995, which is incorporated herein by reference in its entirety.

The MAP algorithm provides the logarithm of the ratio of the a posteriori probability (APP) of each information bit being "1" to the APP of the data bit being "0." The probability value is given by equation (1) of Robertson et al. The computation of the APP requires computing the forward recursion ($\alpha_k(\cdot)$), the backward recursion ($\beta_k(\cdot)$), and the branch transition probabilities (denoted $\gamma i(\cdot)$ in Roberston et al.). To reduce the computational complexity of the MAP algorithm, the Max-Log-MAP and Log-MAP algorithms perform the entire decoding operation in the logarithmic domain. In the log domain, multiplication operations become addition operations, thus simplifying numeric computations involving multiplication. However, the addition operations in the non-log domain become more complex in the log domain. For example, the summation of two metric $e^{x_1}$ and $e^{x_2}$ is straight forward in the non-log domain and is accomplished by adding the two metric $e^{x_1}+e^{x_2}$. But in the log-map algorithm, the metric that is being calculated is $x_1$ and $x_2$. In order to add the two metric in the non-log domain, the metric $x_1$ and $x_2$ must first be converted to the non-log domain by taking the exponential, then adding the exponentiated metric, and finally taking the logarithm to revert back to the log domain. Thus, the sum of metric $x_1$ and $x_2$ is computed as: $\log(e^{x_1}+e^{x_2})$. Equivalently, the computation can be rewritten as:

$$\log(e^{x_1}+e^{x_2}) = \max(x_1, x_2) + \log(1+e^{-|x_1+x_2|}), \quad (i)$$

which can be simplified by approximating the function $\log(1+e^{-|x_1+x_2|})$ by a look up table. Thus the approximation for the sum of the two metric is:

$$\log(e^{x_1}+e^{x_2}) \approx \max(x_1, x_2) + \log_{table}(|x_1-x_2|), \quad (ii)$$

where $\log_{table}(|x_1-x_2|)$ is an N-entry look up table. It has been shown that as few as 8 entries is sufficient to achieve negligible bit error or frame error degradation. The look-up table, $\log_{table}(|x_1-x_2|)$, is one-dimensional because the correction values only depend on the argument $|x_1-x_2|$. FIG. 1 illustrates an exemplary N-entry look-up table used in the computation of equation (ii) above in the Log-MAP decoding algorithm. In FIG. 1, look-up table 100 includes two data fields. Data field 102 includes N entries of the table indexes z, denoted as $z_0, z_1, \ldots,$ and $Z_{N-1}$, where z is defined as $|x_1-x_2|$. Data field 104 includes the corresponding N entries of the computed table values of $\log_{table}(z)$, denoted as $a_0, a_1, \ldots,$ and $a_{N-1}$, which are the computed values of the equation $\log(1+e^{-z})$. To address look-up table 100 for a given value of z, the value z is compared to the defined ranges of the table indexes $z_0, z_1, \ldots,$ and $z_{N-1}$ to determine in which threshold range z belongs. The defined ranges of table thresholds are as follows:

$$z < z_1, \quad \log_{table}(z) = a_0,$$

$$z_1 \le z < z_2, \quad \log_{table}(z) = a_1,$$

$$z_2 \le z < z_3, \quad \log_{table}(z) = a_2,$$

$$\vdots \qquad \vdots$$

$$z_{N-1} \le z, \quad \log_{table}(z) = a_{N-1}.$$

When the correct table threshold range is identified, for example, when z is within the range of $z_1$ and $z_2$ (data cell 103), the value $a_1$ (data cell 105) will be returned by look-up table 100.

However, improvements to turbo decoding using the Log-MAP logarithms are desired to further reduce the complexity of the turbo decoder and to reduce the decoder processing time.

SUMMARY OF THE INVENTION

A method is provided for performing a table look-up operation on a first table having N entries where the first table includes a first data field of table index values and a second data field of computed table values. The method includes generating a second table having kN entries based on the first table. The second table is generated by: generating a first data field including table index values being selected from a predefined range, the table index values having a second interval derived from a first interval selected from one or more intervals of the table index values of the first table, the second interval being a value represented by an n-bit binary number; and generating a second data field including computed table values derived from the computed table values of the first table or computed based on the function defining the second data field. The method further includes computing an index value z, extracting address bits from the index value z, where the address bits are data bits more significant than the (n−1)th bit of the index value z, and addressing the second table using the address bits.

The table look-up method of the present invention can be applied to turbo decoding using the Log-MAP algorithm for improving the overall performance of the turbo decoding operation. Furthermore, the table look-up method of the present invention can be applied to look-up tables which have been scaled as well as look-up tables which have not been scaled.

BRIEF DESCRIPTION OF THE DRAWINGS

FIG. 7 is a scaled look-up table according to another embodiment of the present invention.

FIG. 8 is a wireless receiver incorporating a turbo decoder according to one embodiment of the present invention.

In the present disclosure, like objects which appear in more than one figure are provided with like reference numerals.

DETAILED DESCRIPTION OF THE PREFERRED EMBODIMENTS

An Implementation of a Turbo Decoder

In a digital communication system employing turbo codes, information bits to be transmitted over a communication channel is encoded as an information sequence (also called systematic information) and two or more parity sequences (also called parity information). The information sequence and the parity sequences are multiplexed to form the code word. A turbo encoder includes two or more constituent encoders for generating the parity sequences. Typically, the constituent encoder of the turbo encoder is a recursive systematic convolutional encoder. Turbo encoding is described in detail in the aforementioned article by Berrou et al, "Near Shannon limit error-correcting coding and decoding: turbo codes." The output of the turbo encoder can be punctured in order to increase the code rate. When puncturing is used, a predetermined pattern of bits is removed from the code word. After encoding, the code word is modulated according to techniques known in the art and transmitted over a noisy communication channel, either wired or wireless. In the present embodiment, an AWGN (additive white Gaussian noise) communication channel with one-sided noise power spectral density $N_0$ is assumed.

Figure 2:
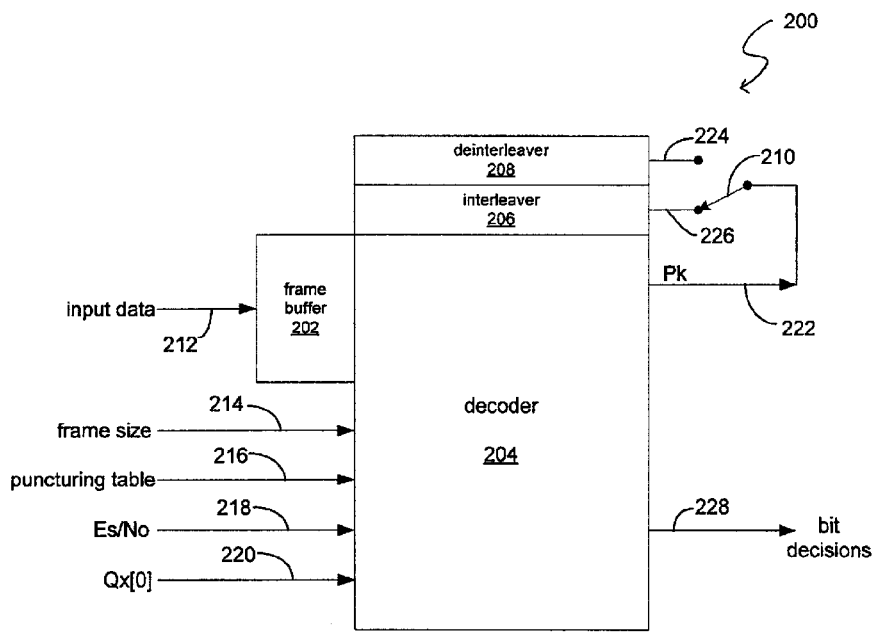
FIG. 2 is a block diagram of a turbo decoder according to one embodiment of the present invention.

When the transmitted code word is received by a receiver, the received data stream is demodulated, filtered, and sampled in accordance with techniques known in the art. The received data stream is then separated into a received information data stream and a received parity data stream and both are provided to a turbo decoder for decoding. FIG. 2 is a block diagram of a turbo decoder according to one embodiment of the present invention. Turbo decoder 200 includes a frame buffer 202 for storing input data, including both the systematic and parity information, received on the communication channel. In FIG. 2, input data on bus 212 has already been demodulated, filtered, and sampled by a signal processor (not shown) according to techniques known in the art. In one embodiment, the input data is stored in a 4-bit two's complement format. Additional information necessary for the decoding operation is also provided to turbo decoder 200. The additional information can include, but is not limited to, the frame size of the input data (bus 214), the puncturing table (bus 216), the signal to noise ratio $Es/N_0$ (bus 218), and the first quantizer level Qx[0] (bus 220). The quantizer level information is optional and is needed only when the input data is quantized for fixed point processing. The puncturing table information is also optional and is needed only when puncturing is used in the turbo encoding process.

Turbo decoder 200 further includes a decoder 204, an interleaver 206 and a deinterleaver 208. Decoder 204 is an elementary decoder implementing the Log-MAP decoding algorithm for computing the a posteriori probabilities (APP) of the individual information bits. Decoder 204 performs metric computations as detailed in Robertson et al. which include three major computational components: the forward probability $\alpha_k$, the backward probability $\beta_k$, and the extrinsic information Pk. Decoder 204 produces a soft information, denoted Pk, for the systematic information received on output bus 222. Output bus 222 is coupled to a switch 210 which alternately connects soft information Pk to either the input port 226 of interleaver 206 or the input port 224 of deinterleaver 208. Switch 210 is provided to enable the use of one decoder (decoder 204) in the two-stage iterative decoding process of turbo decoding. The detailed operation of turbo decoder 200 will be explained in more detail below in reference to FIG. 3. The decoding process continues for a predefined number of iterations and final bit decisions are made at the end of the last iteration. Decoder 204 then provides bit decisions on output bus 228 which represents the information bits decoded by the turbo decoder 200.

Figures 3, 4:
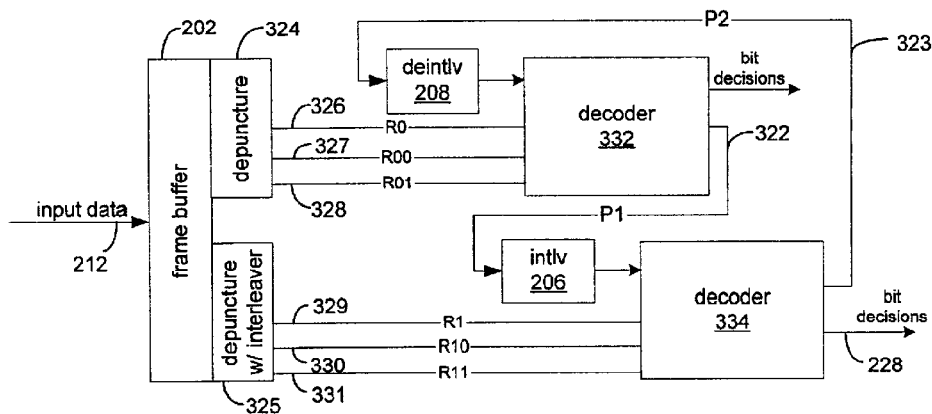
FIG. 3 is a block diagram illustrating a complete iteration of the decoding operation of the turbo decoder in FIG. 2.
FIG. 4 is a scaled look-up table according to one embodiment of the present invention.
Figure 5:
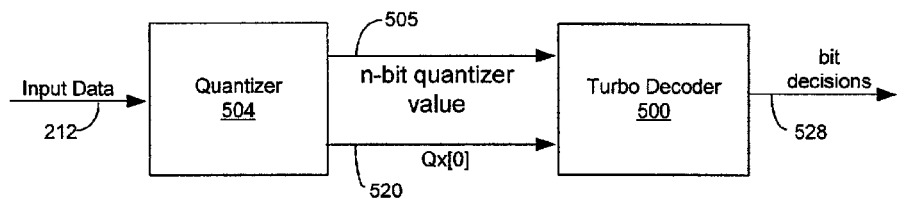
FIG. 5 is a block diagram of a receiver incorporating a quantizer and a turbo decoder according to one embodiment of the present invention.
Figure 6:
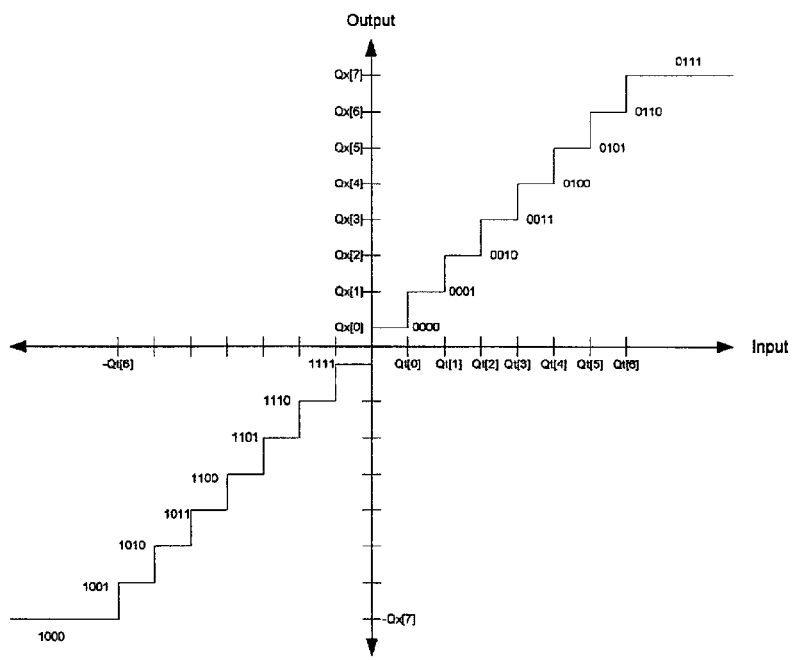
FIG. 6 illustrates a 4-bit uniform quantizer.

FIG. 3 is a block diagram illustrating a complete iteration of the decoding operation of turbo decoder 200. After the received data is demodulated, the received input data (bus 212) is provided to frame buffer 202 for storage. When appropriate, the input data is first depunctured by depuncture block 324 and depuncture with interleaver block 325 using the puncturing table information supplied to the decoder on bus 216 (FIG. 2). Each iteration of the turbo decoding process consists of two stages of decoding. The first stage of decoding, performed by decoder 332, operates on the systematic information R0 (bus 326), encoded information R00 and R01 (buses 327 and 328) representing the encoded bits generated by a first encoder in the turbo encoder which encoded the message, and a posteriori information P2 (bus 323) computed in the second stage and deinterleaved by deinterleaver 208. The second stage of decoding, performed by decoder 334, operates on the interleaved systematic information R1 (bus 329), encoded information R10, and R11 (buses 330 and 331) representing the encoded bits generated by a second encoder in the turbo encoder, and a posteriori information P1 (bus 322) computed in the first decoding stage and interleaved by interleaver 206. Data sequences R1, R10, and R11 from frame buffer 202 are depunctured by depuncture with interleaver block 325 before being provided to decoder 334.

In operation, the a posteriori information P1 (also called the extrinsic information), computed in the first stage by decoder 332, is stored in a buffer in interleaver 206. In the present embodiment, a posteriori information P1 is stored in 8-bit two's complement format. Similarly, the a posteriori information P2, computed in the second stage by decoder 334, is stored in a buffer in deinterleaver 208. In the present embodiment, P2 is also stored in 8-bit two's complement format. After a predefined number of iterations of the decoding process, the resulting bit decisions are provided on bus 228.

Because the two stages of decoding are identical except for the input data, decoder 332 and decoder 334 are identical elementary decoders. In fact, because the two decoders operate with different set of input data at different times, only one decoder block is needed in actual implementation of the turbo decoder, as shown in FIG. 2. In turbo decoder 200 of FIG. 2, switch 210 couples output bus 222 to input port 226 of interleaver 206 during the first decoding stage. Upon completion of the first decoding stage, decoder 204 (functioning as decoder 332) stores extrinsic information P1 in the buffer in interleaver 206 and switch 210 switches from input port 226 to input port 224, thereby connecting output bus 222 to deinterleaver 208. The second decoding stage proceeds with extrinsic information P1 stored in interleaver 206 and decoder 204 (functioning as decoder 334) generates extrinsic information P2 which is then stored in the buffer in deinterleaver 208 for use by decoder 204 in the next iteration of the decoding process. At the completion of the second decoding stage, switch 210 connects output bus 222 back to input port 226 of interleaver 206 for the next iteration of decoding. Therefore, only one decoder is actually needed to implement the two stage decoding process in turbo decoder 200.

In FIGS. 2 and 3, the turbo decoder performs a two-stage iterative decoding process, either using one decoder for both stages or using two constituent decoders as shown in FIG. 3. Of course, the turbo decoder of the present invention can include two or more decoding stages or constituent decoders. The number of decoding stages or constituent decoders is a function of the number of constituent encoders in the turbo encoder used to encode the input data. For a turbo encoder consisting of N constituent encoders, the turbo decoder will have the corresponding N number of constituent decoders or decoding stages in each iteration of the decoding process.

As part of the decoding process, the received data is typically scaled appropriately by various parameters before metric calculations are carried out by the decoder. In one case, the scaling includes weighing the received data by the inverse of the noise variance $\sigma^2$ of the communication channel. The weighing is necessary because of the Gaussian noise assumption. The noise variance $\sigma^2$ is derived from the signal-to-noise ratio information, $Es/N_0$, provided to turbo decoder 200 on lead 218. The signal-to-noise ratio $Es/N_0$ of a communication channel is determined according to known estimation techniques. In another case, when quantization for fixed point processing is used, the log table entry is scaled by the first quantizer level Qx[0] (bus 220 of FIG. 2) so that the input data and the table values are the same unit. Furthermore, when the decoding operation is to be performed using fixed point processing, the received data may need to be scaled accordingly to ensure that the appropriate dynamic range and precision are achieved in the metric computation. In conventional turbo decoders, the scaling of the received data is carried out by scaling the entire frame of the received data stored in the frame buffer. Because the received data includes large number of data bits, the scaling operation requires a large number of computations and introduces undesired latency into the decoding process.

In accordance with the principles of the present invention, a method and an apparatus are provided to enable turbo decoder 200 to perform both the scaling operation and the decoding operation with greater efficiency. In turbo decoder 200 of the present invention, decoder 204 uses a scaled look-up table for computing the function $\log(e^{x_1}+e^{x_2})$ in the Log-MAP decoding algorithm. The scaled look-up table of decoder 204 incorporates the scaling operation of the received data in the table entries. Because only entries in the scaled look-up table need to be scaled by the desired scale factors, as opposed to the entire frame of the received data, and because the scaled look-up table has only a few entries, a significant reduction in the number of computations is realized. The use of the scaled look-up table in turbo decoder 200 of the present invention provides for faster decoding operation and a less complex decoder implementation.

As discussed above, the Log-MAP decoding algorithm requires computing the function $\log(e^{x_1}+e^{x_2})$ or $\ln(e^{x_1}+e^{x_2})$ for a series of argument values $x_1$ and $x_2$. In turbo decoder 200, the argument values $x_1$ and $x_2$ are derived from the input data stored in frame buffer 202 which have not been scaled. As described above, the function $\log(e^{x_1}+e^{x_2})$ can be approximated by:

$$\log(e^{x_1}+e^{x_2})=max(x_1, x_2)+\log(1+e^{-|x_1-x_2|}), \quad \text{(iii)}$$

$$\approx max(x_1, x_2)+\log_{s\text{-}table}(|x_1-x_2|), \quad \text{(iv)}$$

where the calculation of the second term of equation (iii) is accomplished by the use of the scaled look-up table, $\log_{s\text{-}table}(|x_1-x_2|)$. The values stored in the scaled look-up table serve as a correction function to the first term of equation (iii) involving the maximization of the argument value $x_1$ and the argument value $x^2$. An approximate computation of the function $\log(e^{x_1}+e^{x_2})$ in the decoding operation is realized through the use of equation (iv). The scaled look-up table is generated at the beginning of each frame of received data. In one embodiment, the scaled look-up table is stored in a memory location within decoder 204. The memory location can be implemented as typical memory devices such as a RAM and registers. In another embodiment, the scaled look-up table is stored as a logical circuit in decoder 204.

One embodiment of the scaled look-up table of the present invention will now be described with reference to FIG. 4. Scaled look-up table 400 is an N-entry precomputed look-up table and includes two data fields. Data field 402 includes N entries of the table indexes (or table threshold values) $\tilde{z}$, denoted as $\tilde{z}_0, \tilde{z}_1, \tilde{z}_2, \ldots,$ and $\tilde{z}_{N-1}$. In table 400, table index $\tilde{z}$ is scaled by the noise variance $\sigma^2$ according to the following equation:

$$\tilde{z}=z\sigma^2, \text{ where } z=|x_1-x_2|. \quad \text{(v)}$$

As mentioned above, argument values $x_1$ and $x_2$ are derived from the input data which have not been scaled. The table indexes $\tilde{z}$ are selected from a predefined range of $|x_1-x_2|$ argument values. In one embodiment, the table indexes $\tilde{z}$ are selected at regular intervals within the predefined range.

Table 400 further includes a data field 404 which includes N entries of the computed table values, $\log_{s\text{-}table}(\tilde{z})$, according to the equation:

$$\log_{s\text{-}table}(\tilde{z})=\log(1+e^{-\tilde{z}})\sigma^2. \quad \text{(vi)}$$

Each entry of the computed table values, $\log_{s\text{-}table}(z)$, is computed based on $z=|x_1-x_2|$ and corresponds to each entry of the table index $\tilde{z}$. In scaled look-up table 400, the computed table values of data field 404 are also scaled by the noise variance $\sigma^2$, resulting in N entries of computed table values denoted as $\tilde{a}_0, \tilde{a}_1, \tilde{a}_2, \ldots,$ and $\tilde{a}_{N-1}$. By incorporating the scaling of the noise variance $\sigma^2$ in scaled look-up table 400, scaling of the entire frame of received data is circumvented and turbo decoder 200 can perform decoding computations with greater efficiency.

Scaled look-up table 400 is addressed by first computing an index value z based on the argument values $x_1$ and $x_2$ according to the equation $z=|x_1-x_2|$. The argument values $x_1$ and $x_2$ are derived from the input data in frame buffer 202 which have not been scaled. Then, the index value z is compared with table indexes $\tilde{z}$ in data field 402 to determine to which table index range the index value z belongs. The threshold conditions for scaled look-up table 400 is as follows:

$$z < \tilde{z}_1, \quad \log_{table}(z) = \tilde{a}_0,$$
$$\tilde{z}_1 \leq z < \tilde{z}_2, \quad \log_{table}(z) = \tilde{a}_1,$$
$$\tilde{z}_2 \leq z < \tilde{z}_3, \quad \log_{table}(z) = \tilde{a}_2,$$
$$\vdots \qquad \vdots$$
$$\tilde{z}_{N-1} \leq z, \quad \log_{table}(z) = \tilde{a}_{N-1}.$$

For example, if index value z satisfies the threshold condition $\tilde{z}_1 \leq z < \tilde{z}_2$, then index value z belongs to table index cell 406 of data field 402 and scaled look-up
where y is the numeric value of the 4-bit quantizer value received on bus 505. The same quantization rule applies to negative input values. In addition, the quantizer value may also need to be scaled appropriately to achieve the desired dynamic range and precision. When dynamic range adjustment is applied, the quantizer output used in the metric calculation is:

$$(2y+1)\rho, \quad \text{(viii)}$$

where y is the numeric value of the 4-bit quantizer value received on bus 505 and $\rho$ denotes the scale factor for dynamic range adjustment. In this instance, turbo decoder 500 needs to scale the input data according to equation (x) above before metric calculations are carried out. According to another embodiment of the present invention, turbo decoder 500 uses a scaled look-up table 700 (FIG. 7) for metric calculations involving computing the function $\log(e^{x_1}+e^{x_2})$ in the Log-MAP decoding algorithm. Scaled look-up table 700 is an N-entry precomputed scaled look-up table and includes two data fields. Data field 702 includes N entries of the table indexes z', denoted as $z'_0, z'_1, z'_2, \ldots,$ and $z'_{N-1}$. In scaled look-up able 700, table index z' is scaled by the noise variance $\sigma^2$, the first quantizer level Qx[0], and scaling factor ρ for dynamic range adjustment according to the following equation:

$$z' = z\rho\sigma^2/Qx[0], \quad (ix)$$

where $z=|x_1-x_2|$. The table indexes z' are selected from a predefined range of $|x_1-x_2|$ argument values. In one embodiment, the table indexes z' are selected at regular intervals within the predefined range.

Table 700 further includes a data field 704 which includes N entries of the computed table values, $\log_{s\text{-}table}(z')$, according to the equation:

$$\log_{s\text{-}table}(z') = \log(1+e^{-z})\rho\sigma^2/Qx[0]. \quad (x)$$

Each entry of the computed table values, $\log_{s\text{-}table}(z)$, is computed based on $z=|x_1-x_2|$ and corresponds to each entry of the table indexes z'. In scaled look-up table 700, the computed table values of data field 704 are scaled by the noise variance $\sigma^2$, the first quantizer level Qx[0], and scaling factor ρ, resulting in N entries of computed table values denoted as $a'_0, a'_1, a'_2, \ldots,$ and $a'_{N-1}$. In the present embodiment, the scale factor for dynamic range adjustment ρ is chosen to be the powers of two to simplify the multiplication process. When dynamic range adjustment is used, the scale factor for dynamic range adjustment ρ is applied to both the input data and to scaled look-up table 700. In conventional systems, the computational burden is heavy because the turbo decoder has to scale the input data by the noise variance and the dynamic range adjustment separately. In accordance with the present invention, the input data only needs to be scaled by the dynamic range adjustment scale factor. Furthermore, because the scale factor ρ is a power of two, the multiplication process of the input data involves simply a bit-shifting operation. Thus, by incorporating the scaling of the noise variance $\sigma^2$ and the first quantizer level Qx[0] in scaled look-up table 700, scaling of the entire frame of received data is circumvented. Turbo decoder 500 only has to scale the received data by scaling factor ρ which is a simple bit-shifting operation. Thus, turbo decoder 500 can be operated at the same high level of efficiency as turbo decoder 200.

Scaled look-up table 700 is addressed in the same manner as scaled look-up table 400. First, an index value z based on the argument values $x_1$ and $x_2$ according to the equation $z=|x_1-x_2|$ is computed. The argument values $x_1$ and $x_2$ are derived from the input data in frame buffer 202 which have not been scaled. Then, the index value z is compared with table indexes z' in data field 702 to determine to which table index range the index value z belongs. The table threshold conditions for scaled look-up table 700 is given as follows:

$$z < z'_1, \quad \log_{table}(z) = a'_0,$$
$$z'_1 \leq z < z'_2, \quad \log_{table}(z) = a'_1,$$
$$z'_2 \leq z < z'_3, \quad \log_{table}(z) = a'_2,$$
$$\vdots \quad \vdots$$
$$z'_{N-1} \leq z, \quad \log_{table}(z) = a'_{N-1}.$$

Thus, if index value z satisfies the threshold condition $z'_1 \leq z < z'_2$, then index value z belongs to table index cell 706 of data field 702 and scaled look-up table 700 returns the computed value $a'_1$ in cell 707 of data field 704. In this manner, turbo decoder 500, which operates in fixed point processing, uses scaled look-up table 700 for metric calculations involving computing the function $\log(e^{x_1}+e^{x_2})$. In accordance with the present invention, significant reduction in the amount of computations is achieved by providing scaled look-up table 700 which incorporates scaling factors for the noise variance, the quantizer level, and the dynamic range control, circumventing the need to scale the entire frame of received input data.

Applications of the turbo decoder of the present invention can be found in receivers where information is being transmitted over a noisy communication channel. An exemplary application of the turbo decoder of the present invention is illustrated in FIG. 8. Wireless receiver 850 can be a wireless telephone, a pager or other portable personal information devices. Wireless receiver 850 receives digital information transmitted over the communication channel via antenna 852. The received data are demodulated by demodulator 853 and filtered and sampled by Filter/Match/Sample unit 854. The received data are provided to turbo decoder 800 via bus 812. Turbo decoder 800 includes decoder 804 according to the present invention which uses a scaled look-up table stored in a memory unit 805 for metric calculations during the decoding process based on the Log-MAP decoding algorithm. The computation circuits of decoder 804, represented as computation unit 806, access the scaled look-up table by addressing memory unit 805. Turbo decoder 800 provides the corrected received data on bus 828.

The turbo decoder of the present invention can be constructed as an application specific integrated circuit (ASIC) or as a field-programmable gate-array (FPGA) or a digital signal processor (DSP) software or using other suitable means known by one skilled in the art. One of ordinary skill in the art, upon being apprised of the present invention, would know that other implementations can be used to practice the methods and apparatus of the present invention. The scaled look-up table of the present invention can be generated by a processor external to the turbo decoder and downloaded into the decoder during data processing of the input data. The scaled look-up table can also be generated within the turbo decoder with the decoder performing the necessary scaling functions.

Although the present invention has been described above with reference to a specific application in a turbo decoder, the present invention is not intended to be limited to applications in turbo decoders only. In fact, one of ordinary skill in the art would understand that the method and apparatus of the present invention can be applied to any systems performing metric computations of the function $\log(e^{x_1}+ \ldots +e^{x_n})$ in order to simplify the computation process and to achieve the advantages, such as processing speed enhancement, described herein. Furthermore, the present invention has been described as involving the computation of $\log(e^{x_1}+ \ldots +e^{x_n})$; however, one of ordinary skill in the art would have understood that the same method and apparatus can be applied to the computation of $\ln(e^{x_1}+ \ldots +e^{x_n})$ and that the logarithm and natural logarithm expression of the above equations are interchangeable. The above detailed descriptions are provided to illustrate specific embodiments of the present invention and are not intended to be limiting. Numerous modifications and variations within the scope of the present invention are possible.

Look-Up Table Addressing Scheme

As described above, in turbo decoding using the Log-MAP algorithm, an N-entry look-up table is used as a correction factor to approximate the operation stated in equation (i) above. To address the look-up table, whether unscaled (table 100 of FIG. 1) or scaled (tables 400 and 700 of FIGS. 4 and 7), the index value z (defined as $|x_1-x_2|$) is compared with the table indexes (or table thresholds) to determine in which threshold range z belongs. For example, referring to table 100 of FIG. 1, in the turbo decoding process, a given z value is first compared with $z_1$, then with $z_2$, $z_3$, and so on until the correct table threshold range is identified. Note that typically $z_0$ is set to be zero as the values of z are non-negative. Since a given look-up table is addressed repeatedly in the turbo decoding process, the comparison process can be time consuming, particularly for large entry look-up tables. Furthermore, the hardware implementation involving comparators can be complex.

In accordance with another aspect of the present invention, a look-up table addressing scheme is provided for improving the speed of the table look-up operation and for significantly reducing the complexity of the hardware implementation of the look-up table. The look-up table addressing scheme of the present invention uses linearly spaced thresholds for the table indexes and allows the look-up table to be addressed using address bits extracted from the index value z. In this manner, the table look-up operation can be performed quickly since no comparisons are needed in the table look-up operation. Furthermore, the look-up table addressing scheme of the present invention can be applied to turbo decoding using the Log-MAP algorithm as described above to achieve improvements in the overall performance of the turbo decoding operation.

Figure 9:
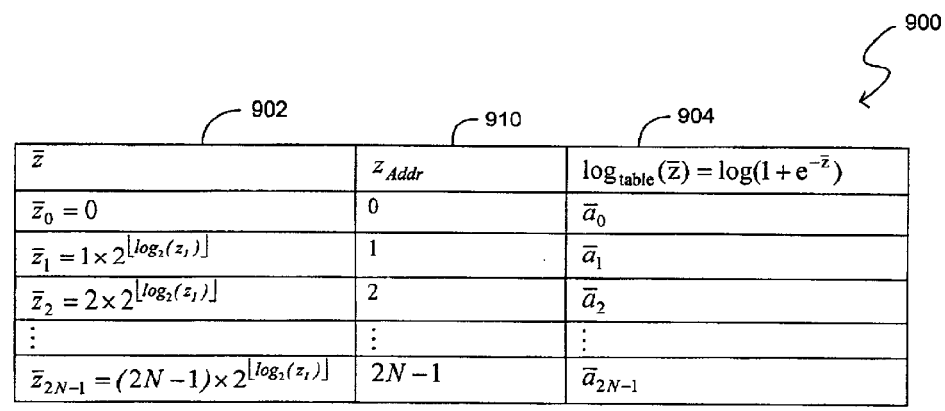
FIG. 9 is a 2N-entry look-up table with modified table threshold conditions for use in the Log-MAP decoding algorithm according to one embodiment of the present invention.

The look-up table addressing scheme of the present invention generates a modified look-up table based on the original look-up table. FIG. 9 illustrates a modified 2N-entry precomputed look-up table according to one embodiment of the present invention. In FIG. 9, look-up table 900 is generated from an unscaled look-up table (such as table 100 of FIG. 1). This is illustrative only and the look-up table addressing scheme can be applied to a scaled look-up table as well, such as table 400 and table 700 described above to achieve the same result in performance improvement.

Figure 1:
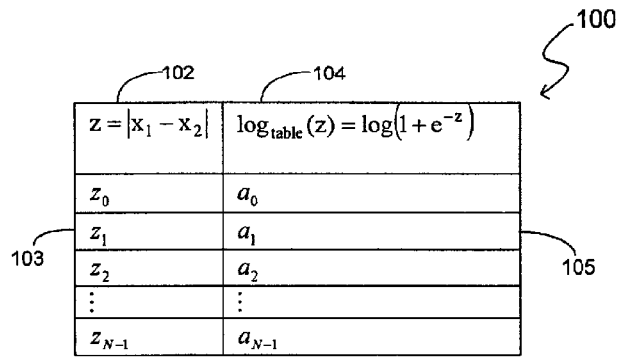
FIG. 1 illustrates an exemplary N-entry look-up table used in the Log-MAP decoding algorithm.

In the present embodiment, modified look-up table 900 is derived from look-up table 100 of FIG. 1 having table indexes $z_0, z_1, \ldots,$ and $z_{N-1}$ in data field 102 and computed table values $a_0, a_1, \ldots,$ and $a_{N-1}$ in data field 104. Of course, if a scaled look-up table is desired, then an N-entry scaled look-up table such as table 400 or table 700 is first generated and modified look-up table 900 can be derived from the scaled look-up table in the same manner the table is derived from an unscaled look-up table. For the purpose of generating modified table 900, the number of entries, N, of the original look-up table is assumed to be a power of 2. If the number of entries N of the original look-up table is not a power of 2, then the look-up table can be padded with additional entries having the same value as the last entry to make the total number of entries a power of 2.

Modified look-up table 900 has 2N entries, that is, it has twice the number of entries as the original look-up table 100. Of course, table 900 can have other numbers of entries, as long as the number of entries is a power of 2, such as 4N. One of ordinary skill in the art would know how to apply the present invention to a modified look-up table having the appropriate number of entries. In the original look-up table 100, the table indexes z are not necessarily evenly spaced. The computed table values $a_0, a_1, \ldots,$ and $a_{N-1}$ are evaluated for each of the respective table indexes $z_0$, $z_1, \ldots,$ and $z_{N-1}$.

In modified table 900, the 2N entries of the table indexes $\bar{z}$, denoted as $\bar{z}_0$, $\bar{z}_1$, and $\bar{z}_2, \ldots,$ and $\bar{z}_{2N-1}$, are linearly spaced from value of $\bar{z}_0$ (typically 0 or a non-negative value) to a maximum value of $\bar{z}_{2N-1}$. In the present embodiment, assuming that the original look-up table is linearly spaced and has a threshold interval of $z_1$, the table indexes $\bar{z}$ of modified table 900 are separated by an interval defined as $2^{\lfloor \log_2(z_1) \rfloor}$, where the notation $\lfloor x \rfloor$ represents the largest integer value not greater than x. Thus, the table indexes $\bar{z}$ are defined as follows:

$\bar{z}_0 = 0;$ $\bar{z}_1 = 1 \times 2^{\lfloor \log_2(z_1) \rfloor};$ $\bar{z}_2 = 2 \times 2^{\lfloor \log_2(z_1) \rfloor};$ $\vdots$ $\bar{z}_{2N-1} = (2N - 1) \times 2^{\lfloor \log_2(z_1) \rfloor}.$ For example, if the table threshold interval $z_I$ of the original look-up table is 30, then $\log_2(30)=4.9$ and the largest integer not greater than 4.9, or $\lfloor 4.9 \rfloor=4$. Then $\bar{z}_1$ represents a threshold value of $2^4=16$ with respect to the original table. Similarly, $\bar{z}_2$ represents a threshold value of 32 with respect to the original table. The table index values $\bar{z}$ are shown in data field 902 of modified table 900 in FIG. 9.

In other embodiments, the table threshold interval of the original look-up table is not linearly spaced. In that case, the interval $z_I$ may be selected from any of the table threshold interval values of the original look-up table. Typically, the smallest table threshold interval of the original look-up table is chosen as the interval $z_1$.

In the present embodiment, the computed table values $\bar{a}_0$, $\bar{a}_1, \ldots,$ and $\bar{a}_{2N-1}$ (data field 904) for each of table indexes $\bar{z}_0, \bar{z}_1, \bar{z}_2, \ldots,$ and $\bar{z}_{2N-1}$ are derived using linear interpolation based on the original computed table values $a_0$, $a_1, \ldots,$ and $a_{N-1}$ and the original table indexes $z_0$, $z_1, \ldots,$ and $z_{N-1}$. Of course, the computed table values $\bar{a}_0$, $\bar{a}_1, \ldots,$ and $\bar{a}_{2N-1}$ can also be generated by evaluating the function $\log(1+e^{-z})$ at each of the new table index values in data field 902. For the purpose of turbo decoding using the Log-MAP algorithm, the computed table values generated by linear interpolation are usually satisfactory.

In the above descriptions, the modified look-up table 900 is derived from an original look-up table. Of course it is also possible to directly generate modified look-up table 900 by specifying the range of table indexes $\bar{z}_0, \bar{z}_1, \bar{z}_2, \ldots,$ and $\bar{z}_{2N-1}$ and computing the corresponding computed table values $\bar{a}_0, \bar{a}_1, \ldots,$ and $\bar{a}_{2N-1}$ for each of the table indexes.

Modified look-up table 900 is addressed using table addresses which are the sequential order of the table entries from 0 to 2N−1. In FIG. 9, look-up table 900 includes a third data field 910 containing the table addresses $z_{Addr}$, where the address value corresponding to each of the computed table values in data field 904. In accordance with the present invention, the computed table values $\bar{a}_0, \bar{a}_1, \ldots,$ and $\bar{a}_{2N-1}$ (data field 904) of table 900 are retrieved from table 900 for a given index value z using table addresses $z_{Addr}$ as in a conventional memory.

Thus, to address modified look-up table 900, a table address $z_{Addr}$ is extracted from an index value z which is computed from the argument values $x_1$ and $x_2$ according to the equation $z=|x_1-x_2|$. The argument values $x_1$ and $x_2$ are derived from the input data in the frame buffer of the turbo decoder. To address table 900 having 2N entries, the number of address bits required, m, is given as follows:

$m = \log_2(2N).$       (xi)

Furthermore, for the purpose of indexing the look-up table, the first n bits of the table address $z_{Addr}$ is dropped, where n is given as:

$$n = \lfloor \log_2(z_I) \rfloor. \quad \text{(xii)}$$

Accordingly, the value n denotes the number of bits needed to represent the interval of the modified table 900 in binary number. Assuming that the index value z has M bits, after the index value z is computed based on argument values $x_1$ and $x_2$, m number of data bits from bit n to bit n+m−1 of index value z are used as the table address to directly access look-up table 900. The m-bit table address in table index value z is illustrated as follows:

$$\underbrace{M-1, M-2, \ldots, n+m,}_{} \underbrace{n+m-1, n+m-2, \ldots, n+1, n}_{\text{table\_address}}, n-1, n-2, \ldots, 1, 0.$$

Bits 0 to n−1 of table index value z represent values within one table threshold interval value $z_I$, where bit n−1 is the most significant bit representing the table threshold interval value. Thus, the m bits of index value z more significant than bit n−1 are used as address bits. By using the m-bit table address to directly address modified look-up table 900 as in a memory, no comparison is needed and the table look-up operation can be performed with a much greater efficiency. Furthermore, the complexity of the hardware implementation of the turbo decoder is also reduced since comparators are no longer needed for the table look-up operations. Note that if a non-zero bit is detected in bits M−1, M−2, . . . , n+m in table index value z, then the last table entry (or the table entry with the largest table index value) is used regardless of the value of the address bits n+m−1, . . . , n+1, n.

In the above description, the look-up table addressing scheme is described with reference to a specific application in turbo decoding. However, this is illustrative only and a person of ordinary skill in the art would appreciate that the look-up table addressing scheme of the present invention can be applied to any mathematical computations involving the use of a look-up table for simplifying the computation and enhancing the speed of the computation. The look-up table addressing scheme of the present invention can be implemented in software or other means known in the art. The above detailed descriptions are provided to illustrate a specific embodiments of the present invention and are not intended to be limiting. Numerous modifications and variations within the scope of the present invention are possible.

Look-up Table Index Value Generation in a Turbo Decoder

In the turbo decoding process based on the Log-MAP algorithm described above, an N-entry look-up table is used as a correction function to the maximization of the argument values $x_1$ and $x_2$ as shown in equation (ii) or (iv). During the turbo decoding process, the look-up table, whether a scaled version or an unscaled version, is accessed continuously to compute the probability calculations, including the backward, forward and extrinsic probabilities. For each probability calculation, the decoding process first computes an index value z based on the argument values $x_1$ and $x_2$ for which the correction value in the look-up table is desired. In the present description, index value z is defined to be: $z=|x_1-x_2|$. Then, the index value z is used to address or access the look-up table for retrieving a correction value from the data field containing the computed table values. Of course, as described above, the look-up table can be addressed in one of several ways. The index value z can be compared with each of the table index values until the correct table threshold range is found. On the other hand, according to the look-up table addressing scheme of the present invention, a modified look-up table can be generated and a portion of the bits in the index value z can be used as address bits to address the modified look-up table.

Figure 10:
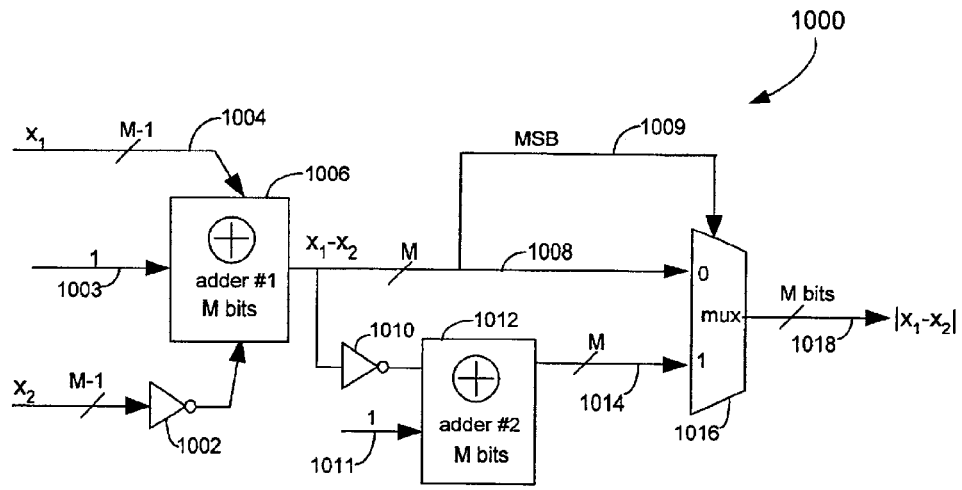
FIG. 10 is a block diagram illustrating one exemplary implementation of an index value generation circuit for computing the index value $z=|x_1-x_2|$.

To compute index value z, the decoding process computes the difference between the argument values $x_1$ and $x_2$ and then takes the absolute value of the difference to generate the index value z. Typically, argument values $x_1$ and $x_2$ are represented as signed numbers expressed in 2's complement format. FIG. 10 is a block diagram illustrating one exemplary implementation of an index value generation circuit for computing the index value $z=|x_1-x_2|$. First, to compute the difference of $x_1$ and $x_2$, circuit 1000 takes the 2's complement of argument value $x_2$ to obtain its negative value. This is done by inverting each bit of argument value $x_2$ using inverter 1002 and then adding a value of 1 (on line 1003) to the inverted value. Then, the negative value of argument value $x_2$ is added to argument value $x_1$ (on line 1004). The two summation steps are performed by an adder 1006 to provide the difference value $x_1-x_2$ in M bits on output line 1008. The computation of index value z then proceeds with taking the absolute value of the difference $x_1-x_2$ (on line 1008). The most significant bit (MSB) of the difference $x_1-x_2$ (on line 1009) is provided to a multiplexer 1016. Since the difference $x_1-x_2$ is expressed in 2's complement, the MSB is a sign bit indicating whether the difference is a positive value (MSB=0) or negative value (MSB=1). If the difference is a positive value, then multiplexer 1016 selects the difference value on line 1008 as the absolute value of the difference. The index value $z=|x_1-x_2|$ having M bits is provided on output bus 1018. If the difference is a negative value, then taking the absolute value involves reversing the sign of the difference value. This is done by taking the 2's complement of the difference $x_1-x_2$. Thus, a second inverter 1010 and a second adder 1012 are provided to invert the bits of difference value $x_1-x_2$ and then adding a value of 1 (on line 1011) to the inverted value. The output of adder 1012 is the absolute value of the difference $x_1-x_2$. Multiplexer 1016 selects the 2's complement value of the difference $x_1-x_2$ computed on bus 1014 when the difference is a negative number.

The straightforward implementation shown in FIG. 10 for computing index value $z=|x_1-x_2|$ has several shortcomings. First, circuit 1000 requires two M-bit fall adders 1006 and 1012. Because adders typically consume a large circuit area, the two-adder implementation of FIG. 10 is not space efficient and, when implemented in an integrated circuit, consumes a large amount of silicon area, thus increasing the manufacturing cost. Second, circuit 1000 in FIG. 10 has a undesirably slow speed of operation because of a long critical path. Specifically, the critical path includes input argument value $X_2$ provided to inverter 1002, adder 1006, inverter 1010, adder 1012 and finally multiplexer 1016. Because the turbo decoding process requires generating index value z repeatedly, it is desirable that index value z be computed quickly and that the index value generation circuit be space efficient.

Figure 11:
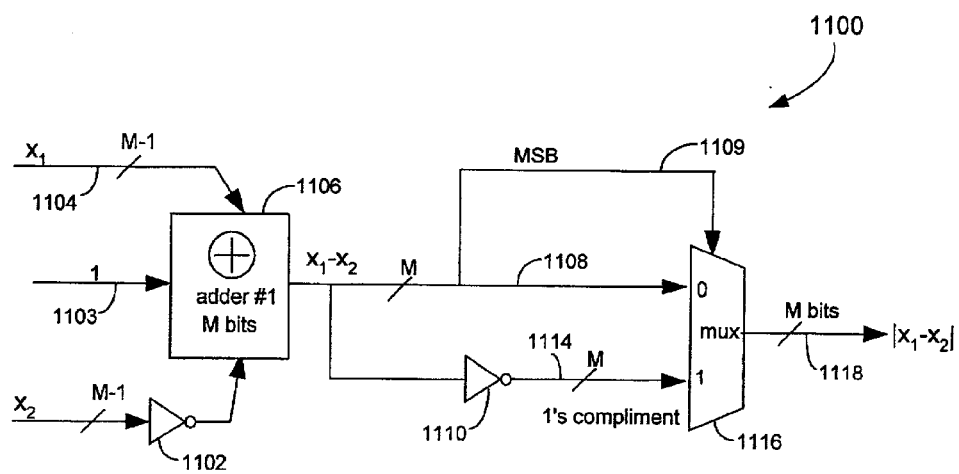
FIG. 11 is a block diagram illustrating an index value generation circuit for computing the index value $z=|x_1-x_2|$ according to one embodiment of the present invention.

According to another aspect of the present invention, an implementation for computing the index value $z=|x_1-x_2|$ in a turbo decoder is provided. FIG. 11 is a block diagram illustrating an index value generation circuit for computing the index value $z=|x_1-x_2|$ according to one embodiment of the present invention. In circuit 1100 of FIG. 11, the difference $x_1-x_2$ is computed in the same manner as in circuit 1000 of FIG. 10. Basically, inverter 1102 and adder 1106 are used to take the 2's complement of argument value $x_2$ and then sum the negative value of $x_2$ to argument value $x_1$. An M-bit value of the difference $x_1-x_2$ is provided on line 1108 to a multiplexer 1116. The operation of multiplexer 1116 is analogous to circuit 1000 of FIG. 10. In FIG. 11, when the difference $x_1-x_2$ is a negative number, the absolute value of the difference $x_1-x_2$ is computed by taking the 1's complement. That is, the difference $x_1-x_2$ is inverted by an inverter 1110 and the inverted value is taken as the absolute value of the difference $x_1-x_2$. The implementation in FIG. 11 saves valuable circuit space by eliminating the need for a second adder such as adder 1012 in FIG. 10. The speed of operation is also improved by eliminating a second adder in the critical path.

In effect, the implementation in FIG. 11 eliminates the second adder by omitting the "addition of 1" operation required in taking the 2's complement to obtain the absolute value of the difference $x_1-x_2$ when the difference is a negative value. Therefore, when the difference $x_1-x_2$ is a negative number, the output value $|x_1-x_2|$ on bus 1118 will be off by the value of 1. However, this discrepancy in the output value $|x_1-x_2|$ is insignificant in the turbo decoding process and in most cases, the discrepancy does not affect the accuracy of the probability calculations at all. It is important to note that the index value z is used to address an N-entry look-up table including N entries of table index values or table threshold values, such as $z_0, z_1, \ldots,$ and $z_{N-1}$ of table 100 of FIG. 1. Thus, even if the index value z is off by 1, in most cases, the table look-up operation will still return the same computed table values because the index value z, whether off by 1 or not, will still fall within the same threshold range in the look-up table. The only time when the off-by-1 discrepancy will cause a different computed table value to be returned is when the index value z falls on the boundary of a threshold value such that the off-by-1 index value z will return a different computed table value as the precise index value z. Because this situation occurs infrequently, the approximation made in FIG. 11 gives negligible performance degradation while providing significant improvement in silicon area consumption and in speed enhancement. In one embodiment, the silicon area required to implement the circuit in FIG. 11 is reduced by 40% than the area required to implement the circuit in FIG. 10. Moreover, the critical path in the circuit of FIG. 11 is shortened by 40% as compared to the critical path in the circuit of FIG. 10. These advantages of the table index value generation circuit described herein has not been appreciated by others prior to the present invention.

A Stop Iteration Criterion for Turbo Decoding

As described above, turbo decoding is an iterative process. For example, in the two-stage iterative decoding process illustrated in FIG. 3, decoder 332 computes a posteriori information P1 (provided on bus 322) which is interleaved and provided to decoder 334. Decoder 334 in turn computes a posteriori information P2 (provided on bus 323) which is deinterleaved and provided back to decoder 332. Typically, the decoding process repeats for a sufficient number of iterations to ensure that the bit decisions converge. The resulting bit decisions for the input data are then provided by decoder 334 on bus 228. However, because the number of iterations needed differs depending on the signal-to-noise ratio (SNR) of the received input data and the frame size of the data, the number of iterations chosen is often either too many or too few, resulting in either inefficiency in the decoding process or inaccurate bit decisions.

Ideally, a stop iteration criterion based on monitoring the convergence of the likelihood function can be used. Thus, at each iteration of the turbo decoding process, the decoder monitors the a posteriori probability values computed by each constituent decoder for each bit in the input data. When the probability values converge, the iteration is stopped and the bit decisions are outputted by the turbo decoder. However, using the convergence of the likelihood function as a stop iteration criterion is inefficient because it requires a significant amount of processing.

Figure 12:
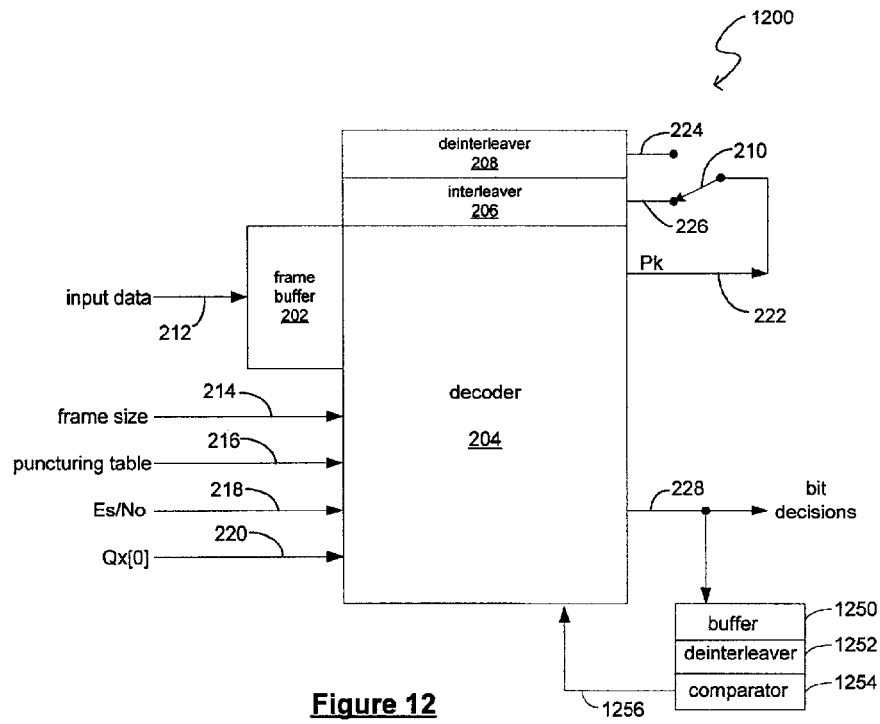
FIG. 12 is a block diagram of a turbo decoder incorporating the stop iteration criterion of the present invention in its decoding operation according to one embodiment of the present invention.
Figure 13:
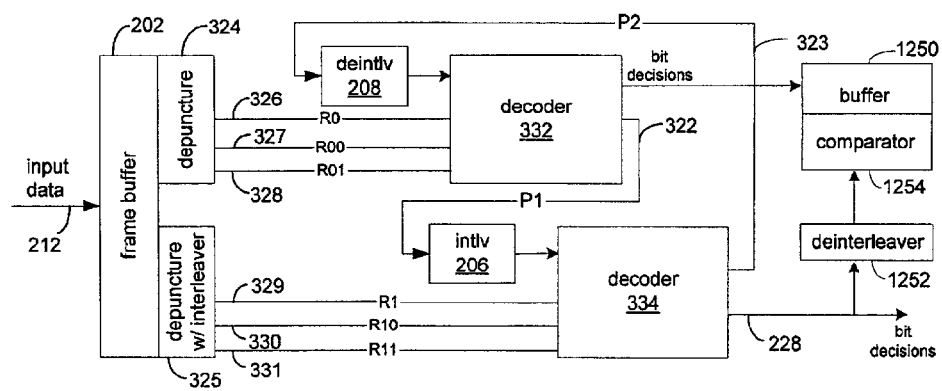
FIG. 13 is a block diagram illustrating a complete iteration of the decoding operation of the turbo decoder of FIG. 12.

According to another aspect of the present invention, a stop iteration criterion for turbo decoding is provided where the turbo decoder monitors the bit decisions from each constituent decoder for each data bit at each iteration and ceases further iterations when the bit decisions converge. When turbo decoder 200 of FIGS. 2 and 3 of the present invention incorporates the stop iteration criterion of the present invention, significant improvement in the decoding performance can be observed. For instance, by stopping the iteration early, the turbo decoder portion of the circuit can be shut down, thus, conserving power. FIG. 12 is a block diagram of a turbo decoder incorporating the stop iteration criterion of the present invention in its decoding operation according to one embodiment of the present invention. FIG. 13 is a block diagram illustrating a complete iteration of the decoding operation of the turbo decoder of FIG. 12. Turbo decoder 1200 of FIGS. 12 and 13 is constructed in the same manner as turbo decoder 200 of FIGS. 2 and 3. Like elements in FIGS. 2, 3, 12 and 13 are given like reference numerals and will not be further described.

Referring to FIG. 12, turbo decoder 1200 includes a decoder 204 which outputs bit decisions on output bus 228. Turbo decoder 1200 further includes a buffer 1250, a deinterleaver 1252 and a comparator 1254. As explained above, in the actual implementation of turbo decoder 1200, only one elementary decoder (decoder 204) is needed to perform the decoding operations. Thus, decoder 204 is used repeatedly for decoding the constituent codes for each stage of the decoding process. In turbo decoder 1200, buffer 1250 is provided for storing the bit decisions computed for each decoding stage during an iteration of the decoding process so that the bit decisions can be compared at the completion of the iteration, as will be described in more detail below. In the present description, one iteration is defined as the processing starting with the first decoding stage through the last decoding stage, each decoding stage operating on its own constituent code. Deinterleaver 1252 is provided to deinterleave bit decisions from decoding stages operating on interleaved systematic information. Finally, comparator 1254 monitors and compares the bit decisions generated at each iteration to determine if further iteration is required.

Referring to FIG. 13, decoder 332 and decoder 334 each operates on its own constituent codes and computes tentative bit decisions based on the respective constituent codes. In accordance with the present invention, after the processing of the constituent codes in each iteration, the turbo decoder proceeds to compare the tentative bit decisions computed by each of constituent decoders to determine whether the bit decisions from each of the decoders are the same. When the tentative decisions from each of the constituent decoders within the same iteration are the same, the turbo decoder stops further iterations and the bit decisions are provided as the final bit decisions. In turbo decoder 1200 including two constituent decoders, tentative bit decisions from decoder 332 and tentative bit decisions from decoder 334 are compared at each iteration by comparator 1254. The bit decisions from decoder 334 have to be deinterleaved by deinterleaver 1252 before being compared with the bit decisions from decoder 332. If decoders 332 and 334 are used recursively to decode other constituent codes in the decoding process, then the bit decisions are first stored in buffer 1250 and the bit decisions are not compared until all bit decisions in an iteration of the decoding process has been completed.

For instance, if the bit decisions from decoders 332 and 334 are the same, then comparator 1254 outputs a command on bus 1256 (FIG. 12) to instruct turbo decoder 1200 to stop the decoding iterations. Bit decisions on either decoder 332 or 334 are outputted as the final decoding result. If the bit decisions are not the same, turbo decoder 1200 continues with the next iteration of the decoding process. The stop iteration criterion of the present invention provides improvement in decoding performance without compromising decoding accuracy. In turbo decoding, since bit decisions are based on the likelihood function, the convergence in bit decisions implies that the likelihood function has converged sufficiently such that the bit decisions are not affected from one decoder to the next decoder in the same iteration. Therefore, when the bit decisions converge in a given iteration, any further iteration will not improve the accuracy of the bit decisions and thus, the iteration can be stopped.

The stop iteration criterion of the present invention can be applied to parallel concatenated turbo decoders with an arbitrary number of constituent codes and frame sizes. For a turbo decoder consisting of N constituent decoders, the tentative bit decisions in the $k^{th}$ iteration for the $n^{th}$ decoder at a time index m is denoted as d(m,k,n). Here, the time index m is used to identify a data bit in the systematic input data s(m) which is normalized by the SNR. In the following equations, a numeral subscript on m (such as $m_1$ and $m_2$) denotes the same data bit being associated with the respective constituent decoder (such as decoder 1 and decoder 2). With respect to the N constituent decoders, the tentative bit decisions are given as follows:

Decoder 1:
$$d(m, k, 1) = \text{sgn}\left(2s(m) + p(m_1, k, 1) + \sum_{n=2}^{N} p(m_n, k-1, n)\right);$$

Decoder 2:
$$d(m, k, 2) = \text{sgn}\left(2s(m) + \sum_{n=1}^{2} p(m_n, k, n) + \sum_{n=3}^{N} p(m_n, k-1, n)\right);$$

Decoder 3:
$$d(m, k, 3) = \text{sgn}\left(2s(m) + \sum_{n=1}^{3} p(m_n, k, n) + \sum_{n=4}^{N} p(m_n, k-1, n)\right);$$

and

Decoder N:
$$d(m, k, N) = \text{sgn}\left(2s(m) + \sum_{n=1}^{N} p(m_n, k, n)\right);$$

where the function sgn(•) is the sign function and the function p(•) represents the a posteriori probability calculated by the respective decoder. When the parameter operated on by sgn(•) is a negative number, sgn(•) returns a value of "1". When the parameter operated on by sgn(•) is a positive number, sgn(•) returns a value of "0". According to the stop iteration criterion of the present invention, if d(m, k,1)=d(m,k,2)=d(m,k,3)= . . . =d(m,k,N) for m=1,2, . . . M, where M is the frame size of the input data, then the turbo decoder stops the decoding iteration and outputs the bit decisions.

For turbo decoder 1200 consisting of two constituent decoders, the tentative bit decisions on the $k^{th}$ iteration for the two constituent decoders are given by:

$d(m,k,1)=sgn(2s(m)+p(m_1,k,1)+p(m_2,k-1,2))$; and $d(m,k,2)=sgn(2s(m)+p(m_1,k,1)+p(m_2,k,2))$.

If d(m,k,1)=d(m,k,2) for m=1,2, . . . M, turbo decoder 1200 can stop the iteration and output the bit decisions. The stop iteration criterion of the present invention can be incorporated in any turbo decoders, including turbo decoders applying the MAP, Max-Log-MAP or Log-MAP decoding algorithm, to improve the decoding performance.

The above detailed descriptions are provided to illustrate specific embodiments of the present invention and are not intended to be limiting. Numerous modifications and variations within the scope of the present invention are possible. The present invention is defined by the appended claims.

We claim:

1. A circuit for decoding input data, comprising:
a decoder implementing the maximum a posteriori probability decoding algorithm, said decoder using a first table for computing the function $\log(e^{x_1}+e^{x_2})$ or $\ln(e^{x_1}+e^{x_2})$ where $x_1$ and $x_2$ are first and second argument values, each derived from said input data, said first table having N entries and storing a first data field including a plurality of table index values and a second data field including a plurality of computed table values corresponding to said plurality of table index values, said plurality of table index values are selected from a predefined range of $|x_1-x_2|$ argument values. said table index values of said first data field are separated by one or more intervals, and said plurality of computed table values are computed based on the equation $\log(1+e^{-|x_1-x_2|})$ or $\ln(1+e^{-|x_1-x_2|})$ for each of said $|x_1-x_2|$ argument values selected for said table index values; and
said decoder using a second table having κN entries and storing a first data field including a plurality of table index values and a second data field including a plurality of computed table values corresponding to said plurality of table index values;
wherein said plurality of table index values of said second table are selected from said predefined range of $|x_1-x_2|$ argument values and have a second interval derived from a first interval selected from said one or more intervals of said first table, said second interval being a value represented by an n-bit binary number; and said plurality of computed table values of said second table are derived from said computed table values of said first table, and
wherein said second table is addressed by using address bits in an index value z and said address bits are data bits more significant than the (n-1)th bit of said index value z.

2. The circuit of claim 1, wherein said plurality of table index values of said first table and said plurality of said computed table values of said first table are scaled by a first scaling factor.

3. The circuit of claim 1, wherein said address bits have m bits, where m is the number of bits required to represent the value kN in binary number.

4. The circuit of claim 1, wherein said second table has 2N entries.

5. The circuit of claim 4 wherein said address bits have m bits, where m is the number of bits required to represent the value kN in binary number.

6. The circuit of claim 1, wherein said decoder computes the function $\log(1+e^{-|x_1-x_2|})$ or $\ln(1+e^{-|x_1|})$ for said index value z by obtaining a first computed table value from said plurality of computed table values in said second table using said address bits.

7. The circuit of claim 6, wherein said first computed table value is added to the greater of said first argument value $x_1$ and said second argument value $x_2$.

8. The circuit of claim 1, wherein said computed table values of said second table are computed by linear interpolation of said computed table values of said first table.

9. The circuit of claim 1, wherein said computed table values of said second table are computed using a function used for computing said computed table values of said first table.

10. A method in a decoder applying the maximum a posteriori probability algorithm for computing the function $\log(e^{x_1}+e^{x_2})$ or $\ln(e^{x_1}+e^{x_2})$ for a first argument value $x_1$ and a second argument value $x_2$, comprising:

(1) generating a first table having N entries, wherein said step of generating a first table further comprises:

generating a first data field including a plurality of table index values being selected from a predefined range of $|x_1-x_2|$ argument values, said plurality of table index values of said first data field being separated by one or more intervals;

generating a second data field including a plurality of computed table values based on the equation $\log(1+e^{-|x_1-x_2|})$ or $\ln(1+e^{-|x_1-x_2|})$ for each of said $|x_1-x_2|$ argument values selected for said table index values;

(2) generating a second table having kN entries, wherein said step of generating a second table further comprises:

generating a first data field including a plurality of table index values being selected from said predefined range of $|x_1-x_2|$ argument values, said plurality of table index values having a second interval derived from a first interval selected from said one or more intervals of said first table, said second interval being a value represented by an n-bit binary number;

generating a second data field including a plurality or computed table values derived from said computed table values of said first table;

(3) computing an index value z;

(4) extracting address bits from said index value z, said address bits being data bits more significant than the (n-1)th bit of said index value z; and (5) addressing said second table using said address bits.

11. The method of claim 10, wherein said generating a first table further comprises:

sealing said table values of said first table by a first sealing factor; and sealing said computed table values of said first table by said first scaling factor.

12. The method of claim 10, wherein said extracting address bits from said index value z comprises:

extracting m bits of address bits, where m is the number of bits required to represent the value kN in binary number.

13. The method of claim 10, wherein said second table has 2N entries.

14. The method of claim 13, wherein said extracting address bits from said index value z comprises:

extracting m bits of address bits, where m is the number of bits required to represent the value 2N in binary number.

15. The method of claim 10, further comprising:

obtaining a first computed table value from said plurality or computed table values in said second table using said address bits.

16. The method of claim 15, further comprising:

determining a greater of said first argument value $x_1$ and said second argument value $x_2$; and adding said first computed value to said greater of said first argument value $x_1$ and second argument value $x_2$.

17. The method of claim 10, wherein said generating a second data field including a plurality of computed table values derived from said computed table values of said first table comprises:

generating said computed table values of said second table by linear interpolation of said computed table values of said first table.

18. The method of claim 10, wherein said generating a second data field including a plurality of computed table values derived from said computed table values of said first table comprises:

computing said computed table values of said second table using a function used for computing said computed table values of said first table.

* * * * *

UNITED STATES PATENT AND TRADEMARK OFFICE
CERTIFICATE OF CORRECTION

PATENT NO.    : 6,868,518 B2
DATED         : March 15, 2005
INVENTOR(S)   : Warm Shaw Yuan et al.

It is certified that error appears in the above-identified patent and that said Letters Patent is hereby corrected as shown below:

Column 4,
Line 29, after "channel" change "is" to -- are --.

Column 5,
Delete the entire section beginning ("table 400 returns the computed value $a_1$ in cell 407 of data...") and ending at line 54 with equation (vii) and insert this same text into the specification beginning at Col. 8, line 47, after "and scaled look up".
Line 54, Equation (vii), change "$Qx[i]=Qx\equiv[0](2y+1)$," to -- $Qx[i]=Qx[0](2y+1)$ --.

Column 6,
Line 4, before "interleaver", change "depuncture with" to -- depunctured by --.
Line 36, after "different", change "set" to -- sets --.

Column 7,
Line 52, after "value", change "$X^2$" to -- $X_2$ --.

Column 15,
Line 43, change "40% than" to -- 40%, compared to --.
Line 48, after "herein", change "has" to -- have --.

Column 17,
Line 6, after "process", change "has" to -- have --.

Column 18,
Line 30, change "selectod" to -- selected --.
Line 31, after "argument", change "values." to -- values, --.
Line 32, after "field", change "arc" to -- are --.

Lines 34-35, after "log" change " $(1+e^-|_x{}^{1-x_2}|)$ " to -- $(1+e^{-|x_1-x_2|})$ --.

Column 19,
Line 2, after "or" change " $\ln(1+e^{-|x_1|})$ " to -- $\ln(1+e^{-|x_1-x_2|})$ --.

Line 41, change "or" to -- of --.

UNITED STATES PATENT AND TRADEMARK OFFICE
CERTIFICATE OF CORRECTION

PATENT NO. : 6,868,518 B2
DATED : March 15, 2005
INVENTOR(S) : Warm Shaw Yuan et al.

It is certified that error appears in the above-identified patent and that said Letters Patent is hereby corrected as shown below:

<u>Column 20,</u>
Line 3, change "sealing" to -- scaling --, both occurences.
Line 4, change "sealing" to -- scaling --.
Line 23, change "or" to -- of --.

Signed and Sealed this

Eighth Day of November, 2005

JON W. DUDAS
*Director of the United States Patent and Trademark Office*